United States Patent [19]
Shiomi et al.

[11] Patent Number: 5,903,015
[45] Date of Patent: May 11, 1999

[54] FIELD EFFECT TRANSISTOR USING DIAMOND

[75] Inventors: Hiromu Shiomi; Yoshiki Nishibayashi; Shin-ichi Shikata, all of Itami, Japan

[73] Assignee: Sumitomo Electric Industries, Ltd., Japan

[21] Appl. No.: 08/528,028

[22] Filed: Sep. 14, 1995

[30] Foreign Application Priority Data

Sep. 16, 1994 [JP] Japan ..................... 6-221785

[51] Int. Cl.$^6$ ................ H01L 31/312; H01L 29/80
[52] U.S. Cl. ............................ 257/77; 257/280
[58] Field of Search .................. 257/77, 192, 194, 257/280

[56] References Cited

U.S. PATENT DOCUMENTS

| | | | |
|---|---|---|---|
| 5,300,188 | 4/1994 | Tessmer et al. | 437/228 |
| 5,523,588 | 6/1996 | Nishimura et al. | 257/77 |

FOREIGN PATENT DOCUMENTS

| | | |
|---|---|---|
| A-0 457 508 | 11/1991 | European Pat. Off. . |
| A-0457508 | 11/1991 | European Pat. Off. . |
| 3-278474 | 12/1991 | Japan . |
| 4-22172 | 1/1992 | Japan . |
| 4-293272 | 10/1992 | Japan . |
| 4-293273 | 10/1992 | Japan . |
| 4-302172 | 10/1992 | Japan . |
| 4-354139 | 12/1992 | Japan . |
| 5-29608 | 2/1993 | Japan . |
| 5-29609 | 2/1993 | Japan . |
| 5-29610 | 2/1993 | Japan . |
| A-2 254 733 | 10/1992 | United Kingdom . |
| WO-A-92 01314 | 1/1992 | WIPO . |

OTHER PUBLICATIONS

Shiomi et al; "Pulse doped P–Channel Metal Semiconductor FET"; pp. 36–38, Jan. 16, 1995.

"Characterization of Boron–Doped Diamond Epitaxial Films and Applications for High–Voltage Schottky Diodes and Mesfet", Shiomi et al., from the Proceedings of the Second International Conference on New Diamond Science and Technology, Sep. 23–27, 1990, Washington, DC.

"High–Voltage Schottky Diodes on Boron–Doped Diamond Epitaxial Films", Shiomi et al., Japanese Journal of Applied Physics, vol. 29, No. 12, Dec. 1990, pp. L2163–L2164.

Shiomi et al., "Electrical Characteristics of Metal Contacts to Boron–Doped Diamond Epitaxial Film", Japanese Journal of Applied Physics, vol. 28 No. 5 (May 1989) pp. 758–762.

Fujimori et al., "Diamond Devices Made of Epitaxial Diamond Films", Diamond and Related Materials, vol. 1 No. 5/6 (Apr. 15, 1992) pp. 665–668.

Shiomi et al., "Pulse–Doped Diamond p–Channel Metal Semiconductor Field–Effect Transistor", IEEE Electron Device Letters, vol. 16 No. 1 (Jan. 16, 1995) pp. 36–38.

*Primary Examiner*—Wael Fahmy
*Attorney, Agent, or Firm*—Pennie & Edmonds LLP

[57] ABSTRACT

A field effect transistor in accordance with the present invention comprises a buffer layer made of a highly resistant diamond on a substrate; an active layer which is made of a conductive diamond on the buffer layer and has such a dopant concentration that conduction of carriers is metallically dominated thereby and such a thickness that dopant distribution is two-dimensionally aligned thereby; a cap layer made of a highly resistant diamond on the active layer; a gate electrode layer formed on the cap layer so as to make Schottky contact therewith; and a source electrode layer and a drain electrode layer which make ohmic contact with a laminate structure of said buffer, active and cap layers. Namely, the active layer is formed as a so-called δ-dope layer or pulse-dope layer doped with a conductive dopant, while being held between both highly resistant buffer and cap layers. Accordingly, even when the dopant concentration in the conductive diamond layer is increased, a high gain, as an excellent controllability and an excellent temperature-stability in operation characteristics can be obtained.

6 Claims, 3 Drawing Sheets

FIELD EFFECT TRANSISTOR USING DIAMOND

BACKGROUND OF THE INVENTION

1. Field of the Invention

The present invention relates to a field effect transistor, in which a diamond is used as a semiconductor material so that it can stably operate in a high-temperature environment and tolerate high-output operations, and a method of making the same.

2. Related Background Art

Conventionally, in order to develop a semiconductor device which can stably operate in a high-temperature environment and tolerate high-output operations, it has been attempted to use, as a semiconductor material, a diamond synthesized in a vapor phase.

Diamonds have a band gap as large as about 5.5 eV, they do not have an intrinsic region, where conduction of carriers cannot be controlled any more, at a temperature below about 1,400° C. Also, since their permittivity is as low as about 5.5, they have a breakdown electric field as high as about $5 \times 10^6$ V·cm$^{-1}$. Further, they have a large carrier mobility, in particular, such that their electron mobility and hall mobility at a temperature of about 300 K are about 2,000 cm$^2$·V$^{-1}$·s$^{-1}$ and about 2,100 cm$^2$·V$^{-1}$·s$^{-1}$, respectively. Accordingly, a semiconductor device made of a diamond can be expected to operate with a high frequency and a high output at a high temperature.

For example, a diode having a good rectification characteristic, a high pressure resistance, and an excellent temperature-stability has been made by using a diamond. The prior art in this regard is disclosed in detail in Japanese Unexamined Patent Publication No. 3-278474, No. 4-22172, No. 4-293272, No. 4-293273, and No. 4-302172, "Jpn. J. Appl. Phys., vol. 29, no. 12, pp. L2163–L2164, 1990," and the like.

Also, by applying this technique, a diamond is used to form a transistor having an improved operation characteristic. The prior art in this regard is disclosed in detail in Japanese Unexamined Patent Publication No. 4-354139, No. 5-29608, No. 5-29609, and No. 5-29610, "Proceedings of The Second International Conference on New Diamond Science and Technology (Washington, D.C.), Materials Research Society (Pittsburgh, Pa.), pp. 975–1000, 1990," and the like.

SUMMARY OF THE INVENTION

The object of the present invention is to provide, by increasing a dopant concentration in a conductive diamond layer, an field effect transistor having a high gain, an excellent controllability and an excellent temperature-stability in operation characteristics.

Another object of the present invention is to provide a method of making such an field effect transistor.

In order to attain the former object, the present invention provides a field effect transistor comprising (a) a buffer layer made of a highly resistant diamond formed on a substrate; (b) an active layer which is made of a conductive diamond on the buffer layer and has such a dopant concentration that conduction of carriers is metallically dominated thereby and such a thickness that dopant distribution is two-dimensionally aligned thereby; (c) a cap layer made of a highly resistant diamond on the active layer; (d) a gate electrode layer formed on the cap layer so as to make Schottky contact therewith; (e) a source electrode layer which makes ohmic contact with a laminate structure of the buffer, active and cap layers; and (f) a drain electrode layer which makes ohmic connect with the laminate structure of the buffer, active and cap layers.

Preferably, the dopant concentration in the active layer is within the range of $10^3$–$10^5$ ppm. It is particularly preferable that the dopant concentration in the active layer is within the range of $5 \times 10^3$ ppm to $10^5$ ppm. Preferably, the thickness of the active layer is within the range of 1 nm to 2 μm. It is particularly preferable that the thickness of the active layer is within the range of 1 nm to 1 μm. Preferably, the thickness of the cap layer is within the range of 10 nm to 2 μm.

In order to attain the latter object, the present invention provides a method of making a field effect transistor, comprising the steps of (a) a first step in which a buffer layer made of a highly resistant diamond, an active layer which is made of a conductive diamond on the buffer layer and has such a dopant concentration that conduction of carriers is metallically dominated thereby and such a thickness that dopant distribution is two-dimensionally aligned thereby, and a cap layer made of a highly resistant diamond on the active layer are formed by being successively mounted on a substrate and (b) a second step in which a gate electrode layer is formed on the cap layer so as to make Schottky contact therewith and each of source electrode layer and a drain electrode layer which makes ohmic contact with a laminate structure of the buffer, active and cap layers is formed.

Preferably, in the first step, the dopant concentration in the active layer is set within the range of $10^3$–$10^5$ ppm. It is particularly preferable in the first step that the dopant concentration in the active layer is set within the range of $5 \times 10^3$ ppm to $10^5$ ppm. Preferably, in the first step, the thickness of the active layer is set within the range of 1 nm to 2 μm. It is particularly preferable in the first step that the thickness of the active layer is set within the range of 1 nm to 1 μm. Preferably, in the first step, the thickness of the cap layer is set within the range of 10 nm to 2 μm.

In the field effect transistor and method of making the same as constructed above, the dopant concentration in the active layer is set to a value which metallically dominates conduction of carriers, while the thickness of the active layer is set to a value which two-dimensionally align dopant distribution. Namely, the active layer is formed as a so-called δ-dope layer or pulse-dope layer doped with a conductive dopant, while being held between both highly resistant buffer and cap layers.

Accordingly, since the conductive dopant is localized in the laminate structure of the buffer, active, and cap layers, fluctuation in its distribution as an impurity decreases. Thus, since a potential well is generated as a V-shaped indentation along the layer direction of the active layer in this laminate structure, scattering of carriers due to the mutual action between lattice vibration and carrier, i.e., phonon, is reduced. Therefore, the carrier mobility increases, thereby improving the mutual conductance in the active layer.

Also, since a highly resistant cap layer is formed between the gate electrode layer and the active layer, gate-leakage current is prevented from being generated even when the dopant concentration in the active layer is relatively high. Therefore, as the rectification ratio between the gate electrode layer and active layer increases, transistor characteristics excellent in operation controllability are obtained.

Further, since the carriers in the active layer are dominated by a metallic conductance, the Fermi level of the active layer approaches a valence band or a conduction band. Accordingly, the dependence of the carrier density on temperature decreases. On the other hand, in the laminate structure of the buffer, active, and cap layers, the carrier density is averaged, on the basis of the sizes of the buffer and cap layers, so as to be smaller than the value corresponding to the dopant concentration in the active layer. Accordingly, even when the dopant concentration in the active layer is relatively high, the carrier mobility is prevented from decreasing. Therefore, stable transistor characteristics can be obtained within a relatively wide temperature range.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION OF THE PREFERRED EMBODIMENTS

Figure 1:
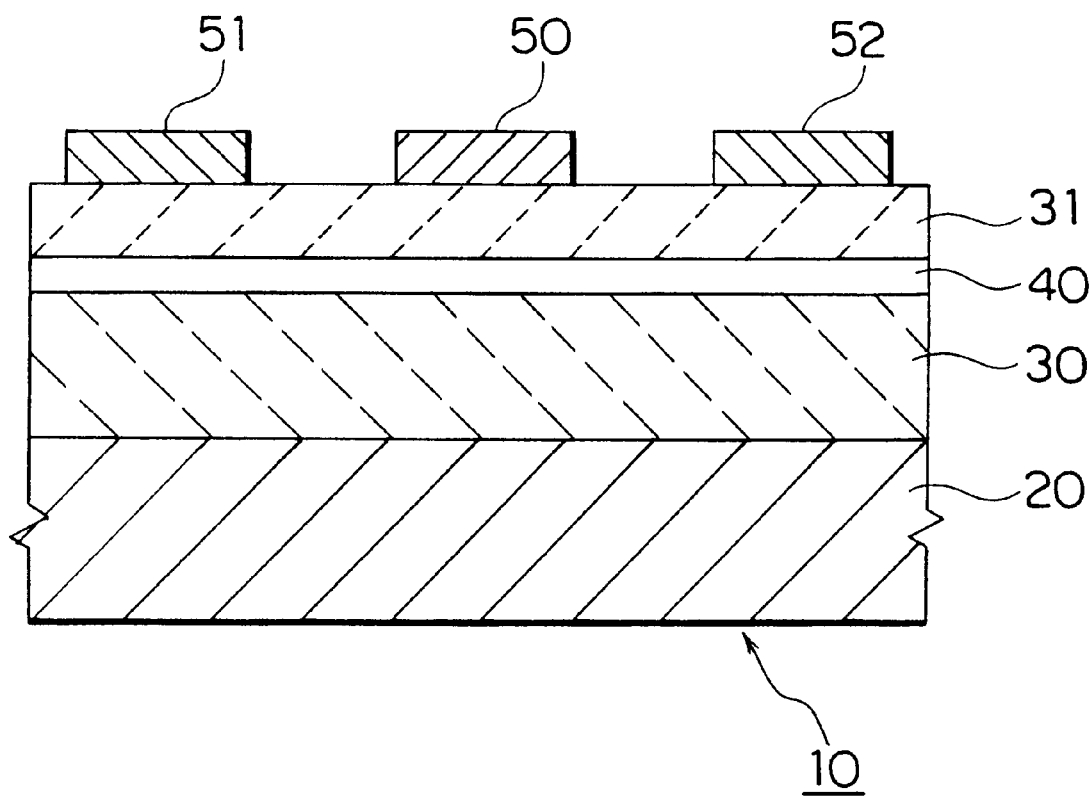
FIG. 1 is a cross-sectional view showing a structure of a field effect transistor in accordance with an embodiment of the present invention.

In the following, the structure and operation of one embodiment concerning the field effect transistor and method of making the same in accordance with the present invention will be explained in detail with reference to FIGS. 1–4. In the explanation of the drawings, the same reference numbers are given to the same elements without repeating their explanations. Also, the size and ratio depicted in the drawings may not always correspond to those explained.

As shown in FIG. 1, an FET (Field Effect Transistor) 10 in this embodiment has a substrate 20 on which a buffer layer 30, an active layer 40, and a cap layer 31 are successively mounted. On the cap layer 31, a gate electrode layer 50 is formed at a predetermined region, while a source electrode layer 51 and a drain electrode layer 52 are respectively formed at two predetermined regions which oppose to each other by way of the gate electrode layer 50.

The substrate 20 is formed as an insulator from a Ib-type single-crystal diamond which has been synthesized in a high pressure. The surface of the substrate 20 bonded to the buffer layer 30 preferably has a lattice plane (100) in order for the buffer layer 30 to effect a favorable crystal growth.

The buffer layer 30 is made of a highly resistant diamond which has been synthesized on the substrate 20 in a vapor phase. This buffer layer 30 has a thickness of about 0.1 $\mu$m to about 10 $\mu$m, while not having intentionally been doped with any conductive-type dopants. That is, the buffer layer 30 is a so-called nondoped diamond layer.

The active layer 40 is made of a p-type diamond which has been synthesized on the buffer layer 30 in a vapor phase. This active layer 40 has a dopant concentration at such a value that conduction of carriers is metallically dominated thereby and a thickness at such a value that dopant distribution is two-dimensionally aligned thereby. Namely, the active layer 40 has a thickness within the range of about 1 nm to about 2 $\mu$m and has been doped with B (boron), as a p-type dopant, in a dopant concentration within the range of about $10^3$ ppm to about $10^5$ ppm. It should be noted, however, that the above-mentioned upper and lower limits of the dopant concentration in the active layer 40 merely indicate their orders.

In particular, in view of the gain required for operation characteristics, the dopant concentration in the active layer 40 is more preferably within the range of about $5 \times 10^3$ ppm to about $10^5$ ppm. Also, in order to attain a favorable confinement effect for a large number of carriers, the thickness of the active layer 40 is more preferably within the range of about 1 nm to about 1 $\mu$m. Namely, the active layer 40 is a so-called boron pulse-doped diamond layer.

When the dopant concentration in the active layer 40 is less than 10 ppm, the mutual conductance gm decreases so that a high gain cannot be obtained. When the dopant concentration in the active layer 40 exceeds $10^5$ ppm, on the other hand, its crystal characteristics deteriorate so as to increase gate-leakage current. When the thickness of the active layer 40 is less than 1 nm, transistor characteristics cannot be obtained due to island-like crystal growth. When the thickness of the active layer 40 exceeds 2 $\mu$m, on the other hand, due to the necessity for increasing the gate voltage, its mutual conductance gm decreases so that a high gain cannot be obtained.

The cap layer 31 is made of a highly resistant diamond which has been synthesized on the active layer 40 in a vapor phase. This cap layer 31 has a thickness of about 10 nm to about 2 $\mu$m, while not having intentionally been doped with any conductive-type dopants. That is, the buffer layer 31 is a so-called nondoped diamond layer.

When the thickness of the cap layer 31 is less than 10 nm, gate-leakage current increases due to an avalanche effect of carriers. When the thickness of the cap layer 31 exceeds 2 $\mu$m, on the other hand, due to the necessity for increasing the gate voltage, its mutual conductance gm decreases so that a high gain cannot be obtained.

The gate electrode layer 50 is made of Al which has been deposited on the cap layer 31. This gate electrode layer 50 has a thickness of about 30 nm to about 900 nm and is in Schottky contact with the cap layer 31.

The source electrode layer 51 is made of Ti which has been deposited on the cap layer 31. This source electrode layer 51 has a thickness of about 30 nm to about 900 nm and is in ohmic contact with the cap layer 31.

The drain electrode layer 52 is formed of Ti which has been deposited on the cap layer 31. This drain electrode layer 52 has a thickness of about 30 nm to about 900 nm and is in ohmic contact with the cap layer 31.

In the following, the operation of this embodiment will be explained.

In the FET 10, the dopant concentration in the active layer 40 is set at such a value that conduction of carriers is mechanically dominated thereby, while the thickness of the active layer 40 is set at such a value that dopant distribution is two-dimensionally aligned thereby. Namely, the active layer 40 is formed as a so-called δ-dope layer or pulse-dope layer doped with a conductive dopant, while being held between the buffer layer 30 and cap layer 31 both of which are highly resistant.

Thus, since a conductive dopant is localized in the laminate structure of the buffer layer 30, active layer 40, and cap layer 31, fluctuation in its distribution as an impurity decreases. Thus, since a potential well is generated as a V-shaped indentation along the layer direction of the active layer 40 in this laminate structure, scattering of carriers due to the mutual action between lattice vibration and carrier, i.e., phonon, is reduced. Therefore, the carrier mobility increases, thereby improving the mutual conductance in the active layer 40.

Also, since the cap layer 31, which is highly resistant, is formed between the gate electrode layer 50 and the active layer 40, gate-leakage current is prevented from being generated. Therefore, as the rectification ratio between the gate electrode layer 50 and the active layer 40 increases, transistor characteristics excellent in operation controllability are obtained.

Further, the carriers in the active layer 40 are dominated by a metallic conductance. Thai is, the Fermi level of the active layer 40 approaches a valence band or a conduction band. Accordingly, the dependence of the carrier density on temperature decreases. On the other hand, in the laminate structure of the buffer layer 30, active layer 40, and cap layer 31, the carrier density is averaged, on the basis of the sizes of the buffer layer 30 and the cap layer 31, so as to be smaller than the value corresponding to the dopant concentration in the active layer 40. Accordingly, even when the dopant concentration in the active layer 40 is relatively high, its carrier mobility is prevented from decreasing. As a result of these features, stable transistor characteristics can be obtained within a relatively wide temperature range.

In the following, the method of manufacture in accordance with this embodiment will be explained.

Figure 2:
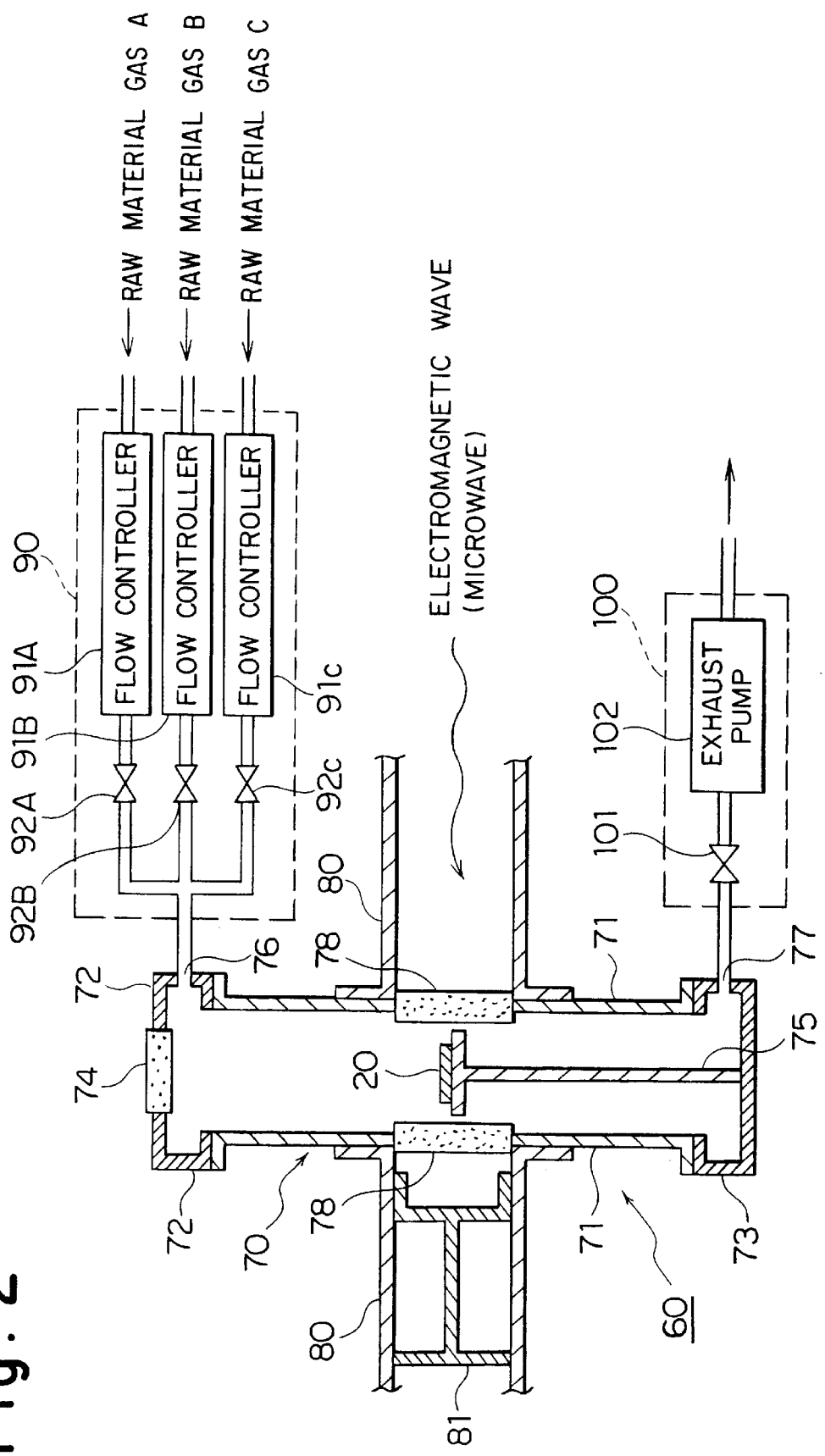
FIG. 2 is a cross-sectional view showing a structure of an apparatus for making the field effect transistor of FIG. 1.

As shown in FIG. 2, a plasma CVD (Chemical vapor Deposition) apparatus 60 used for making the FET 10 in accordance with this embodiment has a reaction vessel 70 in which a diamond is synthesized on the substrate 20 in a vapor phase, a wave guide 80 for applying an electromagnetic wave to a reaction gas in the reaction vessel 70, a reaction-gas introducing system 90 for controlling the flow rates of raw material gases and making them flow into the reaction vessel 70, and an exhaust system 100 for vacuuming the inside of the reaction vessel 70.

In the reaction vessel 70, a reaction chamber 71 having a hollow tubular shape is placed so as to extend vertically. Also, an upper lid 72 and a lower lid 73 are mounted so as to airtightly seal the upper and lower openings of the reaction chamber 72, respectively.

On the bottom surface of the lower lid 73, a supporting rod of a supporting portion 75 is placed so as to extend along the axial direction of the reaction chamber 71. Through the side wall of the lower lid 73, an exhaust opening 77 is formed so as to discharge an exhaust gas from the reaction chamber 71 into the exhaust system 100.

At the center of the inside of the reaction chamber 71, a supporting table of the supporting portion 75 is mounted on the upper end of the supporting rod of the supporting portion 75. On the side wall of the reaction chamber 71, a quartz window 78 which is transparent to an electromagnetic wave is mounted so as to surround the supporting table of the supporting portion 75.

On the top surface of the upper lid 72, an optical window 74 transparent to visible light is mounted such that a step for synthesizing a diamond, in a vapor phase, on the substrate 20 placed on the supporting table of the supporting portion 75 can be observed therethrough. Through the side wall of the upper lid 72, an inlet opening 76 is formed so as to introduce a reaction gas from the reaction-gas introducing system 90 into the reaction chamber 71.

In this reaction vessel 70, the wave guide 80 having a hollow tubular shape is placed so as to extend horizontally while enclosing the quartz window 78 of the reaction chamber 71 therewithin. At an end of the wave guide 80, a radio transmitter (not shown) which generates an electromagnetic wave having a predetermined frequency is placed. At the other end of the wave guide 80, a reflecting plate 81 is placed so as to reflect the electromagnetic wave, which has passed through the reaction chamber 71 and quartz window 78, toward the reaction chamber 71.

To the inlet opening 76 of the reaction vessel 70, a supply tube for supplying the reaction gas from the reaction-gas introducing system 90 is airtightly connected. In the reaction-gas introducing system 90, three flow controllers 91A–91C are placed so as to control three kinds of raw material gases A–C supplied from normal gas cylinders (not shown) with predetermined flow rates, respectively. Also, three supply valves 92A–92C are placed so as to start or stop supplying the three kinds of raw material gases A–C from the three flow controllers 91A–91C, respectively, to the reaction vessel 70.

To the exhaust opening 72 of the reaction vessel 70, an exhaust tube for discharging the exhaust gas to the exhaust system 100 is airtightly connected. In the exhaust system 100, an exhaust pump 102 is placed so as to pump and discharge the exhaust gas discharged from the reaction chamber 70 into a normal scrubber (not shown). Also, an exhaust valve 101 is placed so as to start or stop discharging the exhaust gas from the reaction vessel 70 into the exhaust pump 102.

In the first place, in the plasma CVD apparatus 60 constructed as above, under a condition where the three supply valves 92A–92C and the exhaust valve 101 are closed, the substrate 20 is placed on the supporting table of the supporting portion 75. Then, the exhaust valve 101 is opened and the exhaust pump 102 is driven to vacuum the inside of the reaction vessel 70. After the inside of the reaction vessel 70 reaches a sufficiently high degree of vacuum thereby, the exhaust valve 101 is closed and the exhaust pump 102 is stopped.

Then, two flow controllers 91A, 91B are driven and two supply valves 92A, 92B are opened so as to mix two kinds of raw material gases A, B with their predetermined flow rates and to introduce thus mixed gas into the reaction vessel 70 as a reaction gas. At this stage, the radio transmitter is driven so as to apply an electromagnetic wave having a predetermined frequency from the wave guide 80 to the reaction vessel 70, thereby generating a plasma state of the reaction gas within the reaction chamber 71. Accordingly, the buffer layer 30 comprising a highly resistant diamond is epitaxially grown on the substrate 20.

The raw material gases A, B are $H_2$ with a flow rate of about 50 sccm to about 900 sccm and $CH_4$ with a flow rate of about 0.1 sccm to about 100 sccm, respectively. The electromagnetic wave applied to the reaction vessel 70 is a microwave having a power of about 50 W to about 10 kW and a frequency of about 2.45 GHz. The temperature of the substrate 20 is about 400° C. to about 1,500° C., while the pressure within the reaction vessel 70 is about 0.1 Torr to about 200 Torr. The growth time is about 5 minutes to about 10 hours.

Thereafter, the three flow controllers 91A–91C are driven and the three supply valves 92A–92C are opened so as to mix three kinds of raw material gases A–C with their predetermined flow rates and to introduce thus mixed gas into the reaction vessel 70 as a reaction gas. At this stage, the radio transmitter is driven so as to apply an electromagnetic wave having a predetermined frequency from the wave guide 80 to the reaction vessel 70, thereby generating a plasma state of the reaction gas within the reaction chamber 71. Accordingly, the active layer 40 comprising a p-type diamond is epitaxially grown on the buffer layer 30.

The raw material gases A–C are $H_2$ with a flow rate of about 50 sccm to about 900 sccm, $CH_4$ with a flow rate of about 0.1 sccm to about 100 sccm, and $B_2H_6$ with a flow rate of about 0.1 sccm to about 20 sccm, respectively. The electromagnetic wave applied to the reaction vessel 70 is a microwave having a power of about 50 W to about 10 kW and a frequency of about 2.45 GHz. The temperature of the substrate 20 is about 400° C. to about 1,500° C., while the pressure within the reaction vessel 70 is about 0.1 Torr to about 200 Torr. The growth time is about 5 seconds to about 30 minutes.

Then, the two flow controllers 91A, 91B are driven and the two supply valves 92A, 92B are opened so as to mix two kinds of raw material gases A, B with their predetermined flow rates and to introduce thus mixed gas into the reaction vessel 70 as a reaction gas. At this stage, the radio transmitter is driven so as to apply an electromagnetic wave having a predetermined frequency from the wave guide 80 to the reaction vessel 70, thereby generating a plasma state of the reaction gas within the reaction chamber 71. Accordingly, the cap layer 40 comprising a highly resistant diamond is epitaxially grown on the active layer 40.

The raw material gases A, B are $H_2$ with a flow rate of about 50 sccm to about 900 sccm and $CH_4$ with a flow rate of about 0.1 sccm to about 100 sccm, respectively. The electromagnetic wave applied to the reaction vessel 70 is a microwave having a power of about 50 W to about 10 kW and a frequency of about 2.45 GHz. The temperature of the substrate 20 is about 400° C. to about 1,500° C, while the pressure within the reaction vessel 70 is about 0.1 Torr to about 200 Torr. The growth time is about 5 minutes to about 10 hours.

Thereafter, the substrate 20 on which the buffer layer 30, the active layer 40, and the cap layer 31 have successively been mounted is taken out from the inside of the plasma CVD apparatus 60 and then a normal photolithography technique is used to form an etching mask layer having a predetermined pattern on the buffer layer 30. Thus processed substrate 20 is moved into a reaction vessel of a normal RIE (Reactive Ion Etching) apparatus (not shown) which is then vacuumed to a sufficiently high degree of vacuum and an etching gas is introduced thereinto. At this stage, an electric power having a predetermined frequency is applied to a pair of electrodes in the reaction vessel so as to generate a plasma state of the etching gas. Accordingly, the substrate 20 on which the buffer layer 30, the active layer 40, and the cap layer 31 have successively been mounted is divided into a chip having a predetermined size.

The etching gas is an Ar gas containing about 0.1% to about 10% by volume of $O_2$. The electric power applied to the electrodes in the reaction vessel is a radio-frequency electric power having a power of about 50 W to about 1 kW and a frequency of about 13.56 MHz. The pressure within the reaction vessel is about 0.001 Torr to about 1 Torr, while the etching time is about 1 minute to about 2 hours.

Then, thus formed chip is taken out from the RIE apparatus and the etching mask layer is removed therefrom. Thus processed chip is moved into a reaction vessel of a normal electron beam vapor-deposition apparatus (not shown) and then the inside of the reaction vessel is vacuumed to a sufficiently high degree of vacuum. Under this condition, an electron beam is impinged on a deposition material so as to heat the latter. Thus evaporated deposition material is deposited on the buffer layer 30, thereby forming the gate electrode layer 50. After, this chip is taken out from the electron beam vapor-deposition apparatus, a normal photolithography technique is used to form an etching mask layer having a predetermined pattern on the gate electrode layer 50 and then a normal wet-etching technique is used to form the gate electrode layer 50 into the predetermined pattern. The deposition material is Al, while the etching solution is semicoculine.

Thereafter, the etching mask is removed from this chip. Then, the chip is moved into a reaction vessel in a normal resistance-heating vapor-deposition apparatus (not shown). Thereafter, the inside of the reaction vessel is vacuumed to a sufficiently high degree of vacuum and a heater is driven to heat a deposition material. Thus evaporated deposition material is deposited on the buffer layer 30 to form the source electrode layer 51 and the drain electrode layer 52. After this chip is taken out from the resistance-heating vapor-deposition apparatus, a normal photolithography technique is used to form an etching mask layer having a predetermined pattern on the source electrode layer 51 and the drain electrode layer 52. Then a normal wet-etching technique is used to form these electrode layers into the predetermined pattern. The deposition material is Ti, while the etching solution is buffered fluoric acid.

When the etching mask layer is removed from this chip, the FET 10 in accordance with this embodiment is accomplished.

The δ-doped or pulse-doped FET formed with Si, GaAs, or the like as a semiconductor material is disclosed in detail, for example, in the following literatures:

"IEEE Trans. Electron Devices, vol. ED-28, pp. 505, 1981," "IEEE Trans. Electron Devices, vol. ED-33, pp. 625, 1986," "IEEE Tech. Dig., pp. 829–831, 1986," "Appl. Phys. Lett., vol.57, pp. 1316, 1990," and "IEEE Trans. Electron Devices, vol. 39, pp. 771–775, 1992."

Also, the device formed with a diamond as a semiconductor material so as to have a temperature-dependent carrier density is disclosed in detail, for example, in Japanese Unexamined Patent Publication No. 4-280622.

However, when such a material as Si, GaAs, or the like is used as a semiconductor material for a δ-doped or pulse-doped FET, a technique limited to MBE (Molecular Beam Epitaxy) or the like has to be used under a relatively low-temperature condition in order to prevent dopant atoms in crystal lattices from scattering.

Also, in this case, the δ-doped layer or pulse-doped layer is likely to be broken when the temperature of the element is raised during operation. Further, even when the environmental temperature of the element is at about room temperature, the δ-doped layer or pulse-doped layer is likely to be broken upon a locally-raised temperature due to electric conduction.

Therefore, the inventor of the present application has found that a diamond having a strong inter-lattice energy is applicable as a semiconductor material to improvement in the practicality of the δ-doped or pulse-doped FET. Accordingly, techniques extended to vapor-phase synthesis, high-pressure synthesis, and the like are used to form a δ-doped layer or pulse-doped layer in which the dopant atoms are hard to scatter in the crystal lattices, thereby improving the controllability as well as temperature-stability in operation characteristics.

In the following, Examples concerning this embodiment will be explained.

EXAMPLE 1

According to the method in accordance with the above-mentioned embodiment, a sample of the FET in accordance with this embodiment was formed.

The conditions used for making the buffer layer and the results thereof were as follows:
$H_2$ gas flow: 200 sccm
$CH_4$ gas flow: 1 sccm
Microwave power: 300 W
Substrate temperature: 940° C.
Pressure in reaction vessel: 40 Torr
Growth time: 1 hour
Buffer layer thickness: 200 nm The conditions for making the active layer and the results thereof were as follows. The dopant concentration in the active layer was measured by a normal SIMS (Secondary Ion Mass Spectroscopy).
$H_2$ gas flow: 200 sccm
$CH_4$ gas flow: 1 sccm
$B_2H_6$ gas flow: 10 sccm
$B_2H_6$ gas concentration: 1,000 ppm ($H_2$-diluted)
Microwave power: 300 W
Substrate temperature: 940° C.
Pressure in reaction vessel: 40 Torr
Growth time: 2 minutes
Active layer thickness: 7 nm
Dopant concentration in active layer: 10,000 ppm The conditions for making the cap layer and the results thereof were as follows:
$H_2$ gas flow: 200 sccm
$CH_4$ gas flow: 1 sccm
Microwave power: 300 W
Substrate temperature: 940° C.
Pressure in reaction vessel: 40 Torr
Growth time: 30 minutes
Cap layer thickness: 100 nm The etching conditions for dividing the substrate, on which the buffer layer, the active layer, and the cap layer had been successively mounted, into a chip and their results were as follows:
Volume ratio of $O_2$ in Ar gas: 1%
Radio-frequency electric power: 300 W
Pressure in reaction vessel: 0.02 Torr
Etching time: 1 hour
Etching depth: 330 nm The results of manufacture of the gate electrode layer, source electrode layer, and drain electrode layer were as follows:
Gate electrode thickness: 152.5 nm
Gate length of gate electrode layer: 4 μm
Gate width of gate electrode layer: 39 μm
Source electrode layer thickness: 100.6 nm
Drain electrode layer thickness: 100.6 nm Then, various operation characteristics of thus formed FET were measured.

Figure 3:
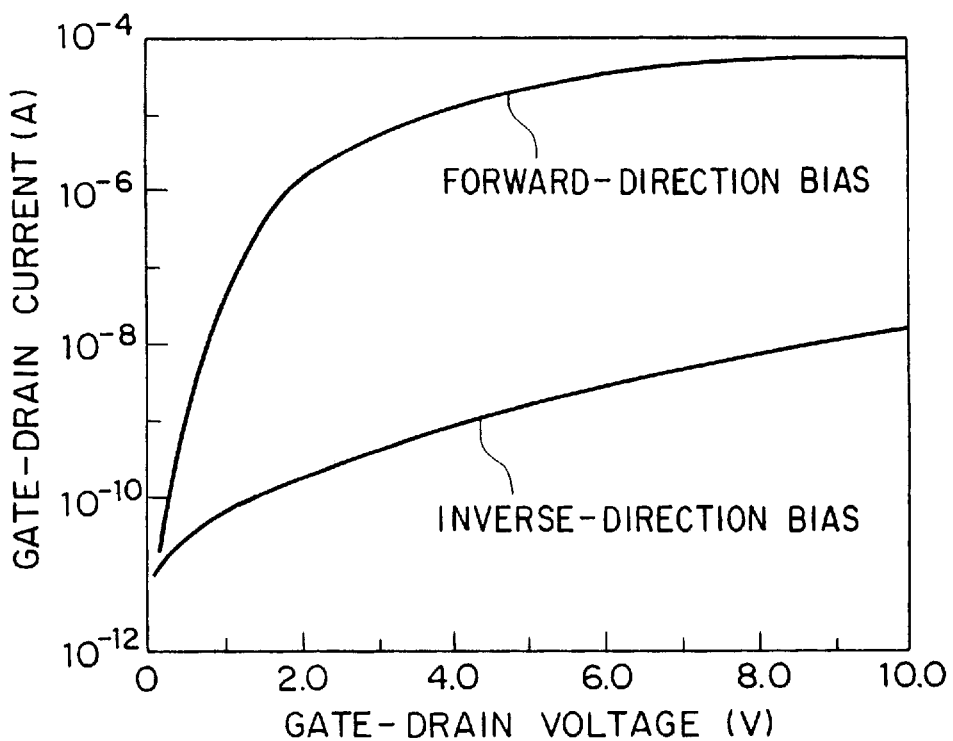
FIG. 3 is a graph showing current-voltage characteristics between the gate and drain in the field effect transistor of FIG. 1.

FIG. 3 shows current-voltage characteristics between the source electrode layer and the drain electrode layer. In this graph, when the current-voltage characteristic at the time of an inverse-direction bias and that at the time of a forward-direction bias are compared with each other, it is found that a favorable rectification ratio was obtained. Until the inverse-direction bias voltage was raised to reach 100 V, no acute increase was observed in gate-leakage current. Accordingly, it is understood that, even when the dopant concentration in the active layer is relatively high, electric currents can easily be controlled and thereby favorable transistor characteristics can be obtained.

Figure 4:
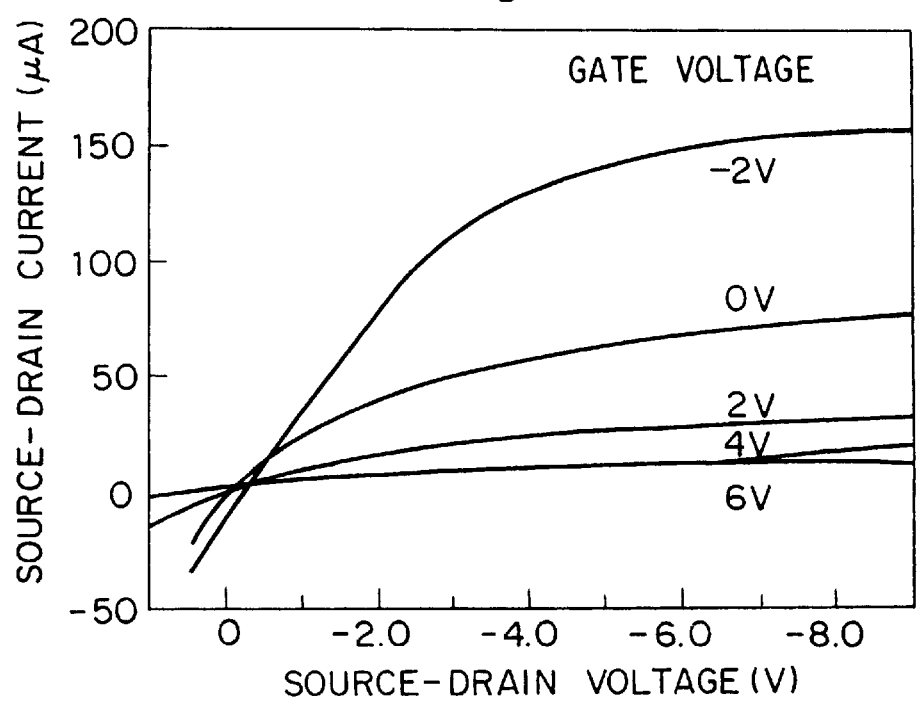
FIG. 4 is a graph showing current-voltage characteristics between the source and drain in the field effect transistor of FIG. 1.

FIG. 4 shows current-voltage characteristics between the source electrode layer and the drain electrode layer. In this graph, on the basis of saturation of the source-drain current with respect to each gate voltage, it is found that a pinch-off characteristic has appeared. When the gate voltage was changed from −4 V to −2 V here, the increase in the source-drain current was 90 μA and the mutual conductance gm in the active layer at room temperature was 116 μS/mm. Such a mutual conductance gm value at room temperature is the greatest in the diamond-constituted transistors reported heretofore. Also, when the environmental temperature was changed from room temperature to 500° C., the change in the mutual conductance gm in the active layer was within 10%. Accordingly, it is recognized that a higher gain, a better controllability and a better temperature-stability in operation characteristics are obtained, as compared with the conventional techniques.

EXAMPLE 2

Substantially the same conditions as those of Example 1 mentioned above were used to form a sample of the FET in accordance with the above-mentioned embodiment which was partially different from that of Example 1. More specifically, the dopant concentration in the active layer herein was set to 5,000 ppm which was different from that of Example 1.

When the current-voltage characteristics between the source electrode layer and the drain electrode layer were measured in thus formed FET, the mutual conductance gm in the active layer was 10 μS/mm. Therefore, it is found that a relatively high gain can be obtained.

EXAMPLE 3

Substantially the same conditions as those of Example 1 mentioned above were used to form a sample of the FET in accordance with the above-mentioned embodiment which was partially different from those of Examples 1 and 2. More specifically, the dopant concentration in the active layer herein was set to 7,000 ppm which was different from those of Examples 1 and 2.

When the current-voltage characteristics between the source electrode layer and the drain electrode layer were measured in thus formed FET, the mutual conductance gm in the active layer was 70 μS/mm. Therefore, it is found that a relatively high gain can be obtained.

EXAMPLE 4

Substantially the same conditions as those of Example 1 mentioned above were used to form a sample of the FET in accordance with the above-mentioned embodiment which was partially different from those of Examples 1–3. More specifically, the dopant concentration in the active layer herein was set to 200,000 ppm which was different from those of Examples 1–3.

When the current-voltage characteristics between the gate electrode layer and the drain electrode layer were measured in thus formed FET, an acute increase was observed in gate-leakage current. However, the rectification ratio was changed to about $10^{-2}$ times that of Example 1 mentioned above. Accordingly, it is recognized that favorable transistor characteristics can be obtained although the crystal characteristics of the active layer are supposed to have been slightly deteriorated by the high-concentration dopant.

COMPARATIVE EXAMPLE 1

Substantially the same conditions as those of Example 1 mentioned above were used to form a sample to be compared with the FET in accordance with the above-mentioned embodiment, which was partially different from those of this embodiment. More specifically, the growth conditions for the active layer were optimized such that the thickness of the active layer was set to 0.8 nm which was different from the above-mentioned embodiment.

In thus formed FET, the active layer was supposed to have been formed like an island rather than a layer. Accordingly, favorable transistor characteristics could not be obtained.

COMPARATIVE EXAMPLE 2

Substantially the same conditions as those of Example 1 mentioned above were used to form a sample to be compared with the FET in accordance with the above-mentioned embodiment, which was partially different from those of this embodiment. More specifically, the thickness of the active layer was set to 2.5 $\mu$m which was different from those of the above-mentioned embodiment.

When the current-voltage characteristics between the source electrode layer and the drain electrode layer were measured in thus formed FET, it became necessary for the gate voltage to increase in order to prevent a pinch-off characteristic from being generated. Accordingly, the mutual conductance gm in the active layer was reduced to 15 $\mu$S/mm.

COMPARATIVE EXAMPLE 3

Substantially the same conditions as those of Example 1 mentioned above were used to form a sample to be compared with the FET in accordance with the above-mentioned embodiment, which was partially different from those of this embodiment. More specifically, the thickness of the cap layer was set to 2.5 gm which was different from those of the above-mentioned embodiment.

When the current-voltage characteristics between the source electrode layer and the drain electrode layer were measured in thus formed FET, it became necessary for the gate voltage to increase in order to prevent a pinch-off characteristic from being generated. Accordingly, the mutual conductance gm in the active layer was reduced to 20 $\mu$S/mm.

COMPARATIVE EXAMPLE 4

Substantially the same conditions as those of Example 1 mentioned above were used to form a sample to be compared with the FET in accordance with the above-mentioned embodiment, which was partially different from those of this embodiment. More specifically, the thickness of the cap layer was set to 5 nm which was different from those of the above-mentioned embodiment.

When the current-voltage characteristics between the gate electrode layer and the drain electrode layer were measured in thus formed FET, an acute increase was observed in gate-leakage current while the rectification was reduced to not more than $10^{-2}$ times that of Example 1 mentioned above. Accordingly, an avalanche phenomenon of carriers is supposed to have occurred in the cap layer due to a strong electric field. Thus, it is recognized that favorable transistor characteristics cannot be obtained.

Without being restricted to the above-mentioned embodiment, various modifications can be effected in the present invention.

For example, in the above-mentioned embodiment, the source electrode layer and the drain electrode layer are formed on the cap layer so as to make ohmic contact therewith. However, with respect to the source- and drain-forming regions on the cap layer, an ion-implantation technique, a selective growth technique for CVD, or the like may be used to form two high-concentration dope regions which have dopant concentrations higher than that of the other region therein. In this case, a series resistance between the source and drain is reduced, thereby yielding a higher gain. In particular, the two high-concentration dope regions of the cap layer are preferably doped with same a dopant as the active layer is doped with.

In fact, in the above Examples, when an ion-implantation technique was used to implant B with a dose of $10^{16}$ cm$^{-2}$ into the source- and drain-forming regions in the cap layer at an acceleration energy of 100 keV, the series resistance between the source and drain was reduced and the mutual conductance gm in the active layer increased by 30%.

Also, the source and drain electrode layers may be directly formed on the active layer so as to make ohmic contact therewith, by patially etching the cap layer. In this case, a series resistance between the source and drain is reduced, thereby yielding a higher gain.

In the above-mentioned embodiment, the active layer is made of a p-type diamond in which B is doped as a p-type dopant. However, when the active layer is made of an n-type diamond in which N is doped as an n-type dopant, operation and results similar to those of the above-mentioned embodiment can be obtained except that movement speed is deteriorated due to a difference between the Hall carrier mobility and the electron carrier mobility.

In the above-mentioned embodiment, a vapor-phase synthesis technique is used to form the buffer layer, active layer, and cap layer from a single-crystal diamond. However, when the buffer layer, active layer, and cap layer are made from a polycrystal diamond by a vapor-phase synthesis technique or from a single-crystal or polycrystal diamond by a high-pressure synthesis technique, operation and results similar to those of the above-mentioned embodiment can be obtained.

In the above-mentioned embodiment, a plasma CVD method is used as a vapor-phase synthesis technique. However, operation and results similar to those of the above-mentioned embodiment can be obtained when various methods indicated in the following are used as the vapor-phase synthesis technique:

(1) a method in which an electric discharge is generated by a direct-current electric field or an alternating-current electric field so as to activate the reaction gas;

(2) a method in which a thermoelectronic emission material is heated so as to activate the reaction gas;

(3) a method in which a surface for growing the diamond is bombarded with an ion;

(4) a method in which light such as a laser or ultraviolet beam is impinged so as to excite the reaction gas; and (5) a method in which the reaction gas is burned.

In the above-mentioned embodiment, a high-pressure synthesis technique is used to form the substrate from a single-crystal diamond. However, when the substrate was made from a polycrystal diamond or a single-crystal diamond by a vapor-phase synthesis technique or from a natural single-crystal diamond, operation and results similar to those of the above-mentioned embodiment can be obtained.

As explained in detail in the foregoing, in the field effect transistor and method of making the same in accordance with the present invention, the active layer is formed as a so-called δ-dope layer or pulse-dope layer doped with a conductive dopant, while being held between both highly resistant buffer and cap layers. Accordingly, since the conductive dopant is localized in the laminate structure of the buffer layer, active layer, and cap layer, fluctuation in its distribution as an impurity decreases, thereby reducing the carrier scattering due to phonons. Therefore, its carrier mobility increases, thereby improving the mutual conductance in the active layer and yielding a high gain.

Also, since a highly resistant cap layer is formed between the gate electrode layer and the active layer, gate-leakage current is prevented from being generated even when the dopant concentration in the active layer is relatively high. Therefore, as the rectification ratio between the gate electrode layer and active layer increases, transistor characteristics excellent in the operation controllability are obtained.

Further, since the carriers in the active layer are dominated by a metallic conductance, the Fermi level of the active layer approaches a valence band or a conduction band. Accordingly, the dependence of the carrier density on temperature decreases. On the other hand, the carrier density in the whole structure is averaged, on the basis of the sizes of the buffer layer and cap layer, so as to be smaller than the value corresponding to the dopant concentration in the active layer. Accordingly, even when the dopant concentration in the active layer is relatively high, the carrier mobility is prevented from decreasing. Therefore, stable transistor characteristics can be obtained within a relatively wide temperature range.

Accordingly, in accordance with the present invention, by increasing the dopant concentration in the conductive diamond layer, the field effect transistor and method of making the same are provided, in which a high gain, an excellent controllability and an excellent temperature-stability in operation characteristics can be obtained.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 6-221785 (221785/1994) filed on Sep. 16, 1994, is hereby incorporated by reference.

What is claimed is:

1. A field effect transistor comprising:
   a substrate;
   a laminate structure provided on said substrate, said laminate structure having:
      an active layer being made of a conductive diamond and having a dopant concentration such that conduction of carriers is metallically dominated and a thickness of 1 nm to 7 nm such that dopant is two-dimensionally aligned;
      a buffer layer provided between said substrate and said active layer and said active layer and in direct contact with said active layer, said buffer layer being made of a highly resistive diamond; and
      a cap layer provided on and in direct contact with said active layer so as to sandwich said active layer with said buffer layer, said cap layer being made of highly resistive diamond, said laminate structure improves the mutual conductance in said active layer;
   a gate electrode layer formed on said cap layer so as to make Schottky contact therewith;
   a source electrode layer which makes ohmic contact with said laminate structure; and
   a drain electrode layer which makes ohmic contact with said laminate structure.

2. A field effect transistor according to claim 1, wherein the dopant concentration in said active layer is within the range of $10^3$–$10^5$ ppm.

3. A field effect transistor according to claim 1, wherein the dopant concentration in said active layer is within the range of $5 \times 10^3$ ppm to $10^5$ ppm.

4. A field effect transistor according to claim 1, wherein wherein said cap layer has a thickness within the range of 10 nm to 2 $\mu$m.

5. A field effect transistor according to claim 1, wherein said cap layer has two high-concentration doped regions which have dopant concentrations higher than that of another region therein and which are doped with same a dopant as said active layer is doped with, and said source and drain electrode layers are formed on the two high-concentration dope regions of said cap layer, respectively.

6. A field effect transistor according to claim 1, wherein said source and drain electrode layers are formed on said active layer so as to make ohmic contact therewith.

* * * * *